Sept. 8, 1964 C. FELDMAN 3,148,310

MICROMINIATURE CIRCUIT BOARD AND METHODS OF MAKING SAME

Filed Oct. 6, 1961

INVENTOR.
CHARLES FELDMAN
BY Hurvitz and Rose

United States Patent Office 3,148,310

Patented Sept. 8, 1964

3,148,310

MICROMINIATURE CIRCUIT BOARD AND METHODS OF MAKING SAME

Charles Feldman, Alexandria, Va., assignor to Melpar, Inc., Falls Church, Va., a corporation of Delaware Filed Oct. 6, 1961, Ser. No. 143,488
21 Claims. (Cl. 317—101)

The present invention relates generally to microminiature circuit elements and more particularly to members for electrically and mechanically interconnecting thin film elements and individual components mounted and deposited on microminiature circuit boards or substrates, and to methods for securing leads and connections to said boards.

In the last several years microminiature circuit elements have been employed in electronic circuitry because of their small volume and weight. This minuteness in size and weight is particularly advantageous in aircraft, rockets, space craft, etc. because of the extreme cost necessary to launch every pound of equipment.

In the past, however, no completely satisfactory system has been devised for integrating microminiature components into complete systems. A simple, unified method is presently needed to form contacts for the thin film electrical leads and resistors which are bonded to the insulated circuit boards or substrates. To secure optimum utilization of the size and weight of microminiature elements, the substrates must be connected together electrically and physically into stacks which form modules that are readily connected together into complete assemblies. To provide maximum flexibility, external connections and active elements should be connectable to any point on the substrate surface. Electrical interconnections between any of the stacked substrates without electrically contacting other substrates is desirable to effect the optimum number of circuit configurations.

To facilitate fabrication of a complete system, it is necessary that interconnecting terminals be bonded to the substrates or circuit boards prior to deposition of the evaporated films which form the electrical components, e.g. leads and resistors. The terminals, after application to the substrate, must be able to withstand the extreme vacuum and temperature (1000° C.) conditions attendant upon component deposition. In a completed microminiature circuit element, the evaporated films must form electrical contacts that directly connect with the previously prepared terminals on the substrate. To provide maximum flexibility in application of components to the substrate, it is essential that actual circuit elements, other than deposited thin film components, be secured to the substrate after deposition of the thin films. A complete module made up of a plurality of stacked substrates containing deposited and attached components, as well as systems of said modules, requires the substrates and components to be interconnected by a method which does not destroy or alter the characteristics of the deposited film components.

To materially reduce the cost of the manufacturing technique, automatic assembly of a complete system comprising a plurality of modules is a necessity.

Accordingly, it is an object of the present invention to provide new and improved microminiature circuit elements and methods for the manufacture of such elements.

Another object is to provide new and improved contacts for microminiature circuit boards or substrates and methods of applying said contacts to said substrates wherein the contacts are securable to the substrate prior to thin component deposition and wherein electrical connections of the contacts to the deposited thin films are easily obtained.

A further object is to provide new and improved stacked, microminiature circuit modules and methods for manufacturing said modules wherein maximum flexibility in electrically connecting components deposited or secured to said substrates together is provided.

It is an additional object to provide a microminiature component and a method of fabricating same wherein circuit elements are attachable to the substrate after deposition of thin film components thereon.

Yet another object is to provide a method of interconnecting deposited and attached film components on microminiature substrates wherein film characteristics are not altered.

A further object is to provide a method for assembling contacts, and components on microminiature substrates and stacking said substrates into modules, wherein the assembly is capable of being completely automated.

Basically, the present invention contemplates the solution of these objects by providing two novel substrate terminal means and methods of manufacture.

In one of the methods, the substrate is provided with a plurality of tapered bores, having frustum conical side wall configurations. A lead having an enlarged end portion, preferably of spherical shape, is inserted through each of the apertures where a terminal is desired. The sphere engages the aperture side walls while the lead extends through the aperture away from the substrate surface. The sphere is fused to the substrate by heating the area around the aperture periphery to a glowing condition and then melting the sphere in the aperture.

Subsequent to attaching the contacts, the thin film components are deposited on the substrate surface. The thin films are electrically connected to the fused contacts in the substrate apertures by very accurately maintaining the aperture and sphere dimensions according to one embodiment. In a modification, these dimensions need not be critically maintained to achieve optimum adherence of the deposited thin film to the contacts because a metal, preferably silver, paste is deposited on the aperture side walls subsequent to contact fusion and prior to film deposition.

In the other method, contacts are formed on a substrate by welding a pair of electrically conducting spheres together through apertures provided in the substrate. The apertures are of substantially hour glass shape and are proportioned relative to the spheres so the spheres contact each other through the neck of the hour glass and contact the aperture side walls. Electrical contact between the spheres and substrate is provided by depositing a thin film of conducting material on the aperture side walls prior to sphere insertion.

It is a feature of the present invention that the substrate is not restricted to glassy, silica materials, but may be utilized with other insulators, for example fiber boards, crystal combinations or slices, and ceramics. This is highly desirable because vacuum deposition processes of thin film terminals cannot be performed usually with the later substrates.

To connect elements other than thin films, e.g. diodes and transistors, on the substrate, the elements are welded to the top of the spherical contacts. Contact between these elements and other points on the substrate is established by the thin film leads deposited directly on the substrate. Electrical contact between a component on one substrate and a component on another substrate is established by a continuous column of spheres extending between the various substrates. These columns of spheres provide both electrical and mechanical connections between the substrates. Electrical insulation of any substrate from the other substrates is accomplished by leaving the conducting material out of the aperture side walls. The spheres in the column extend through the same type apertures in the substrate as the spheres utilized for the contacts.

To assemble the spherical contacts on a substrate or a stack of substrates, welding tips are applied to the spheres at opposite ends of the column. The spheres are sufficiently soft to be compressed against each other and to be compressed against the aperture side walls by the forces exerted by the welding tips. With a metal film in the aperture, the sphere is melted sufficiently to be bonded to it and establish electrical contact between the sphere and substrate. If the aperture is uncoated, mechanical adhesion between the sphere and substrate is achieved by friction between the compressed sphere and the aperture side walls.

To form a completed module with leads extending from one of the substrates suitable for insertion in pin connectors, the first and second types of substrates are combined. This is accomplished by manufacturing a first substrate with leads extending through it. A stacked module with columns of spheres interconnecting the substrates is placed on the first substrate so the sphere which forms the base of each column is located on the contact portion of the fused leads. The sphere columns are simultaneously welded together and to the contact portions of the fused leads. Thus a completed microminiature module that can easily be connected and disconnected in pin contacts is provided.

The above and still further objects, features and advantages of the present invention will become apparent upon consideration of the following detailed description of one specific embodiment thereof, especially when taken in conjunction with the accompanying drawings, wherein.

Figure 1:
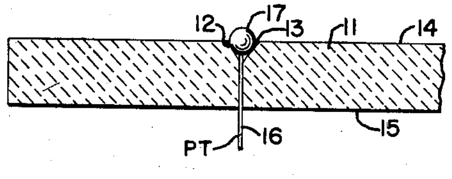
FIGURE 1 is a side sectional view illustrating the relative substrate and lead positions prior to fusion.

Reference is now made to FIGURE 1 of the drawings, which illustrates a side sectional view of substrate 11 taken through the center of an aperture 12 having a conically tapered sidewall 13 extending through the substrate thickness from one surface 14 to the other surface 15. Lead 16, having an enlarged spherical section 17 at one end, is located in the aperture 12 so that the sphere outer surface contacts at least one complete cross section of the tapered conical wall 13. Aperture 12 is formed in substrate 11 so that the cross section on surface 14 is considerably greater than the maximum diameter of sphere 17 and the cross section on substrate surface 15 is considerably less than the maximum diameter of sphere 17. Of course, the aperture diameter on surface 15 must be greater than the diameter of lead 16 which extends through it.

Lead 16 and sphere 17 are preferably preformed from a platinum wire because of the ability of platinum to withstand the temperatures necessary for vacuum deposition on the substrate of thin films utilized as conductors, resistors, etc. The sphere 17 is formed by melting one end of wire 16, and slowly feeding it into the flame of a suitable torch. As lead 16 is melted and pushed into the torch flame, the diameter of ball 17 increases. Sphere 17 is made large enough so that it will drop into aperture 12 of substrate 11 and not rest on the upper surface 14 thereof. The ball, however, is made sufficiently large so that it is substantially tangential with the substrate surface 14.

Substrate 11 is any type of electrical insulator generally employed for micro-circuitry elements and it is preferably formed from a silica glass, ceramic or crystal material. It is necessary for the substrate 11 to possess approximately the same expansion characteristic as the metal utilized to form leads 16 and sphere 17 because of the severe temperatures to which the unit is subjected during vacuum deposition of thin film conductors or resistors on the substrate. During utilization, the unit is frequently subjected to extremes of temperature. These temperatures, which may range between the temperature of liquid nitrogen and 1000° C. cause considerable expansion and contraction of the substrate and the leads secured thereto, which prevents good adhesion between the substrate and leads if the expansion coefficients of the two elements are materially different. Substrate 11 is of typical microminiature element size, being approximately 25 mils between the surfaces 14 and 15 thereof.

The conically shaped aperture 12 is formed in the thin substrate 11 by conventional drilling methods, such as sandblast drilling or air turbine drilling. If sandblast drilling is employed, very fine sand not greater than 30 microns in diameter must be utilized, with a nozzle having a diameter equal to or less than 10 mils. When sandblasting is utilized, the wall taper of aperture 12 is formed naturally due to the decreased sand particle momentum in striking the substrate at points remote from surface 14, where the blast is initially directed. When utilizing air turbine drills, the conical bore is formed by correctly shaping the carbide or diamond burrs and by controlling the extent of drilling to rigid specifications. The diameter of aperture 12 on surface 15 must be considerably less than the maximum diameter of sphere 17 to prevent the sphere from falling all the way through the aperture as it is melted and secured to the substrate. In order to prevent melting of lead 16 from sphere 17, the sidewalls 13 of the aperture must be perfectly circular in cross section and of very small diameter at the side adjacent surface 15.

The required number of apertures for the particular microelement being fabricated are drilled in the substrate by the above described process. The preformed leads with the enlarged spherical ends are inserted in the aperture with the leads extending on the side of the board away from the surface 14 which is to be printed. After all of the apertures have been filled with leads 16 having balls 17 at one end thereof, as illustrated in FIGURE 1, substrate 11 is ready to be heated to fuse the leads thereto.

Initially, the entire silica substrate surface 14 is heated with a hydrogen oxygen torch to a temperature of approximately 1000° C., i.e. to a temperature at which the substrate surface is almost in a glowing condition. Of course for substrates other than silica, the torch temperature must be varied according to the substrate fusion temperature. During this preheating operation, the hydrogen oxygen torch must not be permitted to dwell on any of the spheres 17 to obviate premature sphere melting which results in poor adhesion to the substrate. After substrate surface 14 has reached a temperature of approximately 1000° C., each wire is individually fused to the quartz substrate by slowly rotating the torch around the periphery of each hole 12 on substrate surface 14. This operation is continued until the periphery of hole 12 begins to glow, which occurs at a temperature of between 1300° and 1500° C. for silica.

Figure 2:
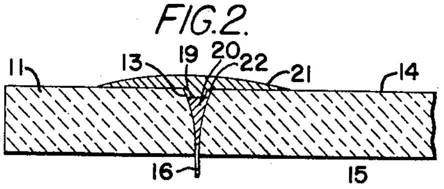
FIGURE 2 is a side sectional view of the structure generally illustrated in FIGURE 1 illustrating the relative substrate, lead and contact positions subsequent to fusion.

When this glow completely surrounds the hole, the torch is finally turned directly on the platinum sphere 17. The temperature of the torch must be sufficient to melt the platinum sphere (1755° C.) to the sidewalls 13 of aperture 12 and thereby fuse the platinum to the sidewalls. As the enlarged portion 17 melts, it loses its spherical shape and settles down into the hole, taking the shape of the conical contour of the hole, as illustrated in FIGURE 2. The top of the fused element 17 is a segment of a sphere that extends almost, but not quite, to the surface 14 of substrate 11. As the leads are fused to the substrate, the entire surface of the substrate is preferably flame polished to enhance vacuum deposition of a pad or thin film circuit element which is plated onto the substrate surface 14.

After the fusion process has been completed, it may be determined that the enlarged end 17 has properly adhered to substrate 11 by noting that the boundary 19 between substrate surface 14 and aperture 12 is round and smooth, rather than sharp, as it was prior to the fusion process. Also if the enlarged head portion 17 of lead 16, proximate to substrate surface 14, is partially flattened out, that is of less curvature than the original sphere 17, as indicated by 20, FIGURE 2, it is ascertained that good adherence of the lead to the substrate 11 has been achieved. If from these inspections it is found that good adhesion between the lead and the substrate has not resulted, the process must be repeated.

Because of the small size of aperture 12 and the enlarged head 17, a small diameter flame must be utilized. However, the flame must have sufficient blast force to cause the platinum ball 17 to spread out against the walls 13 of aperture 12 as it melts. If there is insufficient blast force behind the flame, the enlarged head portion 17 will retain its spherical shape and only melt to a small surface of wall 13. The temperature of the hydrogen oxygen torch is regulated by controlling the amount of oxygen therein. By supplying more oxygen than is needed to support combustion of the flame, the temperature of the element being heated is reduced because the heat carried away from it is increased. It is important that the temperature of the flame be accurately controlled and that too much heat not be applied to the lead or substrate to prevent the edge between the aperture sidewalls 13 and substrate surface 14 from becoming excessively rounded. Excessive heat also causes splattering of the platinum across the substrate surface 14 during the sphere melting process. This is undesirable because it prevents the easy deposition of pads, leads, and resistors which are to be deposited to the substrate.

To provide connections between leads 16, extending from the underneath surface 15 of substrate 11, with leads or other elements deposited on the substrate surface 14, pad 21 (FIGURE 2) is deposited on the substrate surface 14. Pad 21 is deposited on substrate surface 14 in a conventional manner, such as silk screening, painting, or vacuum deposition. Vacuum deposition of pad 21 is preferable to silk screening or painting because the latter result in pads that are generally too thick for thin film elements since they have a sharp discontinuity in thickness at their edge. Such a sharp discontinuity in pad 21 frequency results in a discontinuity in the deposited pad and lead films, thereby resulting in open circuits between elements coated on the substrate 11. This defect in painting and silk screening of pads is obviated by fabricating a pad whose edge is tapered and not as thick as the silk screen or painted pad. Tapering is accomplished with a mask that provides a very gradual shadowing effect in the deposit.

To effect good connection between pad 21 and the segmented spherical surface of pad 17, the shape of aperture 12 must be carefully controlled, as must the size of sphere 17 prior to melting. If these requirements are not met, contact between the top surface 20 of head 17 with pad 21 is poor, resulting in bad electrical connection between the elements on the substrate surface 14 and leads 16 which are connected to an external electrical device in the finished product. Bad connections result because a steep side is developed around the hole and said side is not easily coated during the vacuum deposition of the pad 21 on the substrate surface 14.

It is not necessary to carefully control the shape of aperture 13 and size of sphere 17 if a colloidal silver paste 22, having approximately the same consistency as vaseline, is applied around the periphery of the uncovered wall of aperture 12 above surface 20 subsequent to fusion of head 17. Preferably, the silver paste is fired onto the sidewall 13 until all of the organic material in the paste is decomposed and carried away from the substrate by the firing flame. When the pad 21 is subsequently applied by deposition on the substrate surface 14, it adheres to the silver pasted walls 22 of aperture 12 and to the enlarged head 17 of conductor 16. The metal layer on the side walls is depositable by other methods, such as plating. The pasting process for establishing adherence of pad 21 to enlarged head portion 17 is preferred over the non-paste method because of the relative ease of conducting the additional step as compared to critically maintaining the ball and aperture dimensions.

Figures 3, 6:
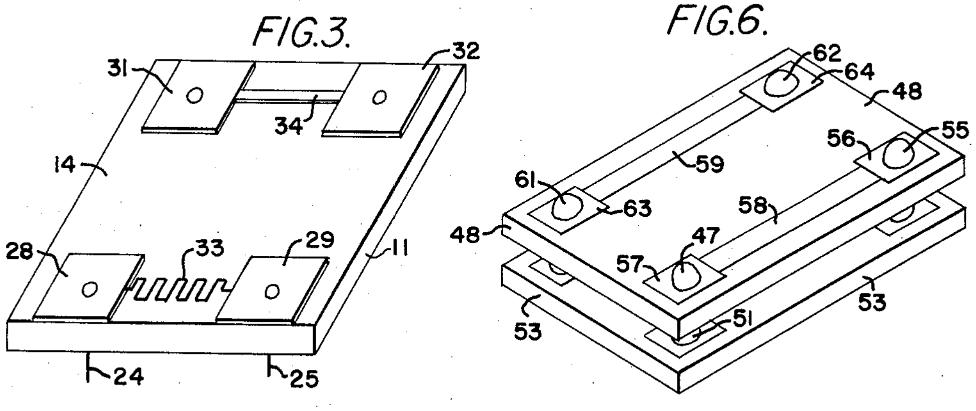
FIGURE 3 is a perspective view of a completed substrate with the leads fused thereon and a pad secured thereto.
FIGURE 6 is a perspective view of the assembly of FIGURE 5.

FIGURE 3 illustrates in perspective view a completed micro-circuitry substrate fabricated according to the present invention. Leads 24 and 25 extend from the underneath side of substrate 11, as shown on the drawing, and interconnect with the pads 28 and 29, respectively. Similar leads (not shown) connect with pads 31 and 32 and extend on the underside of substrate 11. The pads 28, 29, 31 and 32 are vacuum deposited, electrically conductive materials on the substrate surface 14 and permit facile connections between the leads and the various elements coated on substrate surface 14. For example, resistive element 33 is electrically connected between pads 28 and 29, while lead 34 extends between pads 31 and 32. Resistor 33 and lead 34 are vacuum deposited on substrate 11 in the conventional manner which needs no description. Leads 24 and 25 extend from the underneath side of substrate 11 to permit the connection of lead 34 and resistor 33 with external circuit elements which may either be other substrates or electrical devices.

Figure 4:
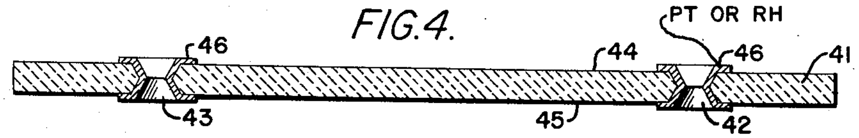
FIGURE 4 is a side sectional view of a substrate after the apertures necessary for sphere welding are formed therein.

Referring now to FIGURE 4 of the drawings, substrate 41 is illustrated in cross sectional view taken through the center of apertures 42 and 43 therein. Hour glass bores or apertures 42 and 43 are drilled in substrate 41 at predetermined locations, dependent on the desired connections and circuitry to be fabricated on the substrate. Substantially hour glass shaped bores 42 and 43 extend through the thickness of substrate 41 and are tapered so they flare from a central minimum diameter to a maximum diameter at the substrate surfaces 44 and 45. Bores 42 and 43 are formed in substrate 41 by drilling or sandblasting from both substrate surfaces 44 and 45. After the circular cross section apertures 42 and 43 are drilled in substrate 41, the aperture walls are coated with a suitable material, such as platinum or rhenium, to establish electrical connection between the substrate elements and the interconnecting elements. The thin platinum or rhenium coatings 46 (shown in exaggerated size on the drawing) are plated on the interior surface of certain apertures, dependent on the desired circuitry, as seen infra. The coatings 46 are extended to the substrate exterior surfaces 44 and 45 to permit connection of pads and external leads to the substrate. The deposited coatings 46 in the apertures and on the substrate surfaces are applied by conventional methods such as electroplating, vacuum deposition, or painting and fusing.

After the apertures of parallel extending substrates 48 and 53 are coated, conducting spheres are placed in the aligned apertures 49 and 52 to electrically and mechanically connect the various substrates together. Sphere 47 is positioned in the upper half of aperture 49 on substrate 48, while sphere 51 is positioned between the lower half of aperture 43 and the upper half of aperture 52 on substrate 53. A further sphere 54 is placed in the lower half of aperture 52. The coefficient of expansion of the spheres are substantially equal to the coefficient of expansion of the substrate to maintain good mechanical and electrical contact between them under varying environments. For silicon substrates it is preferred that Invar spheres be utilized while Pyrex substrates are used in combination with Kovar spheres. Coating of the aperture side walls may be dispensed with if the spheres are coated with a soft layer of silver, platinum or gold to establish electrical connections between the spheres and deposited components. The spheres are dimensioned so that substrates 48 and 53 are sufficiently separated to permit pads and leads to be deposited on the adjacent substrate surfaces. Also the diameters of the spheres and apertures enable the spheres to engage the aperture walls and contact each other through the neck of the hour glass apertures. Thus, sphere 47 contacts sphere 51 at a point half-way between the opposed surfaces of substrate 48 and spheres 51 and 54 contact each other at a point half way between the two opposite surfaces of substrate 53. If the substrate is 25 mils thick, spheres between 25 and 35 mils in diameter are appropriate.

After the spheres are assembled in the desired geometrical configuration, the tips of a welding rod are applied against the two most remotely located spheres 47 and 54 of a particular substrate stacking arrangement and the spheres are welded to each other. During the welding operation, sufficient compressional forces are applied to spheres 47, 51 and 54 to oblate them at their common point of contact and their contact points with the side walls of apertures 49 and 52. The welding operation must produce sufficient heat to melt the platinum spheres at their contact points, i.e. 1755° C. The welded spheres thus serve as mechanical supporting elements for the stacked substrates 48 and 53 and as electrical connections for the deposited leads, components and pads formed on the substrate surfaces.

Substrates 48 and 53, employed with the present method, termed sphereweld, are fabricated from any desired material and are not restricted to glassy, silica type substrates but are selectable from ceramics, fiber boards, crystal slices, or combinations of these materials. Determination of the substrate material employed is made primarily by the environment in which the device is to be ultimately utilized. If temperatures not in excess of 200° C. are expected when the circuit is ultimately utilized, the non-glassy substrates are acceptable but if it is expected the environmental temperatures extend above 500° C., glassy substrates must be employed.

Prior to application of the spheres to the substrate, the various substrate surfaces are fabricated with the desired circuit configuration and circuit elements. Pads 56 and 57 are deposited in contact with the flanged portions of the coated surfaces 46 on the substrate surface 48 either at the time or subsequent to deposition of coatings 46. Resistance element 58 is deposited between pads 56 and 57 in a known manner. Similarly, deposited resistance 59 (FIGURE 6) on substrate 48 is connected to components on substrate 53 by pads 63 and 64 which are electrically connected to spheres 61 and 62, respectively; said spheres being connected through stacked spheres to spheres on the lower substrate in the same manner illustrated for spheres 47, 51 and 54. Connections to a further substrate assembly or an external element are made by placing the spheres located on the lower surface of substrate 53 in electrically engaging relationship therewith. Of course it is to be understood that inductors and capacitors may be deposited on the substrate surfaces and that components are depositable on both surfaces of a particular substrate.

Figure 5:
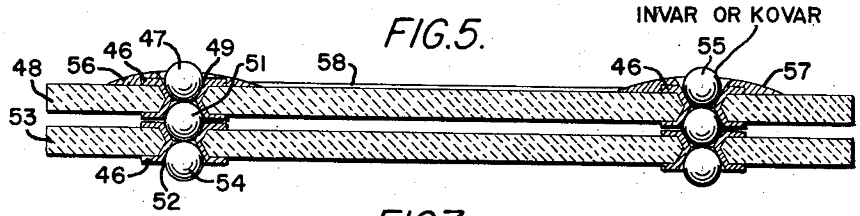
FIGURE 5 is a side sectional view of a pair of substrates of the type illustrated in FIGURE 4 stacked together.
Figure 7:
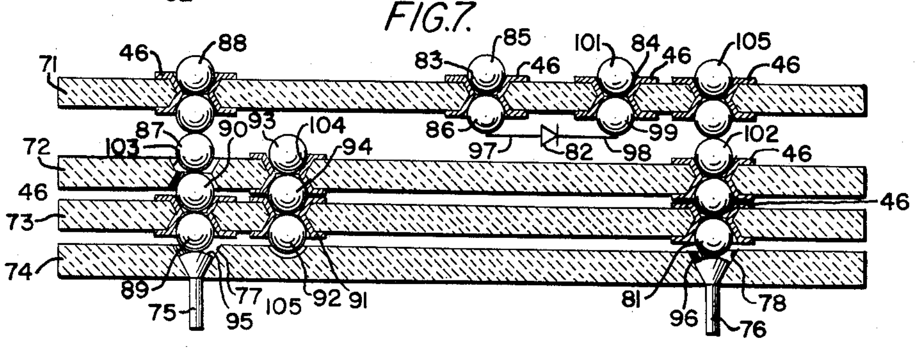
FIGURE 7 is a side sectional view of a completed module utilizing leads and substrates as illustrated in FIGURE 1 and stacked substrates interconnected by spheres as illustrated in FIGURE 6.

To illustrate the manner in which the substrate connection methods and structures of FIGURES 1–3 are combinable with those of FIGURES 4–6, one form of completed module is illustrated in FIGURE 7. The completed module illustrates four parallel substrates 71, 72, 73 and 74. These substrates, shown in cross section through the aperture midsections, are electrically connected to leads 75 and 76, extending from the underneath side of substrate 74.

Substrate 74 includes a pair of circular cross section apertures 77 and 78 which are tapered from a maximum diameter at one substrate surface to a minimum diameter at the opposite substrate surface. The platinum leads 75 and 76 are secured to substrate apertures 77 and 78, respectively by the method illustrated in FIGURES 1 and 2 to present segmented spherical surfaces 95 and 96 at the upper surface of substrate 74. Substrate 73 is connected to substrate 74 by means of spheres 79 and 81, which engage substrate 73, and the segmented spherical upper surfaces 95 and 96 of leads 75 and 76, respectively. In a similar manner, additional spheres are utilized to electrically and mechanically interconnect substrates 72 and 73.

Substrates 71 and 72 are separated from each other by a distance greater than the separation distance of substrates 72, 73 and 74 because of the connection of an external element 82 to the deposited components (not shown) on the surface of substrate 71 most proximate substrate 72. External element 82, which may take the form of a transistor, diode, etc., is attached to substrate 71 and is electrically connected to the deposited components on it prior to stacking substrate 71 with the remainder of the substrates 72–74. One lead 97 of element 82 is connected to the deposited elements on substrate 71 by mounting it on the surface of sphere 86 most remote from substrate 71. Spheres 85 and 86 previously were inserted in coated aperture 83 of substrate 71 in contact with each other. When lead 97 is thus assembled on sphere 86, welding tips are applied between the opposite ends of spheres 85 and 86 and the spheres are welded to each other and lead 97 is welded to sphere 85. Similarly, the other lead 98 of element 82 is connected to substrate 71 via spheres 99 and 101 either at the same or a different time as the connection for lead 97 is established. Because of the added space needed between substrates 71 and 72 for element 82 and spheres 86 and 99, additional spheres 87 and 102 are connected between substrates 71 and 72.

After component deposition or external element connection to each of the substrates 71–72 is completed, the substrates are interconnected by simultaneously welding the main columns of spheres terminated by spheres 88, 89 and 81, 105 together. Thus, welding tips are simultaneously applied to one end of the columns at spheres 88, 105 while other welding tips are simultaneously applied to the other end of the columns at spheres 89 and 81.

As the spheres are welded to each other, they are welded to the deposited metal films in the apertures. Sufficient force is applied to the relatively soft spheres to cause them to be slightly oblated against each other and the aperture walls. The frictional forces between the spheres and aperture walls are sufficient to prevent movement of the substrates even if there is no metal deposited on the aperture walls.

Each of the apertures in substrates 71–73 is provided with a conducting side wall 46 except aperture 103 in substrate 72. No conducting side wall is provided on aperture 103 because there is no electric connection desired between a component on left end of substrate 72 with components on substrates 71 and 73.

Consequently, the left end of substrate 72 is insulated from the main sphere column comprising spheres 87, 88, 89 and 90 by eliminating conducting side wall 46 from aperture 103. Mechanical connection of substrate 72 to substrates 71 and 73 is achieved through the column comprising spheres 87, 88 and 89 even though no electric connection exists between them. This is accomplished by the frictional forces of the oblated surfaces of spheres 87 and 90 contacting the side walls of aperture 103. The welded surfaces of spheres 87 and 90 through the neck of aperture 103 maintain these frictional forces constant for all movements and positions of the modular element.

While it is not desired to connect the left side of substrate 72 to substrates 71 and 73, it is desired to connect this side of substrate 72 only to substrate 73. This is accomplished by providing aligned, coated apertures 91 and 104 in the left side of substrates 73 and 72, respectively. Spheres 92, 93 and 94 are inserted through apertures 91 and 104 to form a column similar to the column comprising spheres 87–90. Spheres 92, 93 and 94 are inserted through apertures 91 and 104 to form a column similar to the column comprising spheres 87–90. Spheres 92, 93 and 94 are welded together prior to assembly of the complete module to effect the desired electrical connections between the elements on substrates 72 and 73.

To provide sufficient space for sphere 92, substrate 74 is provided with a segmented spherical aperture, aligned with apertures 91 and 104, in its surface most proximate substrate 73. Of course, an additional sphere can be inserted in the main columns between substrates 73 and 74 to provide space for sphere 92 and possible heat dissipation, but this may be undesirable because of the added volume necessary for the module.

Of course the configuration illustrated on FIGURE 7 is merely exemplary and is included to disclose some of the possible connections between the substrates and the elements contained thereon.

After the completed module of the type illustrated in FIGURE 7 is assembled, it is ready to be installed in a larger assembly. This is accomplished by placing spheres 89 and 81 on surfaces 95 and 96, respectively and applying welding tips to leads 75 and 76 and spheres 88 and 105. Leads 75 and 76 serve as pin connections to the larger assembly. If pin connections are not utilized, substrate 74 is eliminated and spheres 88 and 105 serve as the connecting elements to the other assembly.

The sphere weld method is easily adapted to complete automation since the same technique for assembling exterior elements on a substrate is employed for connecting the various substrate elements together. The assembling apparatus need only roll the spheres across each substrate unit thereby causing the spheres to fall into the apertures designed to receive them. Of course, in an automatic process, a substrate such as 71, which contains an external component secured thereto by other spheres, must be completely assembled prior to stacking of the various substrates. In the assembling process, after the spheres are located on one substrate surface, the substrate is lowered and additional spheres are positioned on the next substrate to be assembled by rolling them across the substrate surface in a manner similar for the preceding substrate. To remove excess spheres, it is merely necessary to withdraw them from the opposite side of the substrate from which they are initially applied.

While I have described and illustrated one specific embodiment of my invention, it will be clear that variations of the details of construction which are specifically illustrated and described may be resorted to without departing from the true spirit and scope of the invention as defined in the appended claims.

I claim:

1. A method for bonding an electrical lead to a fusible substrate comprising the steps of providing an electrically conducting wire with an enlarged portion at one end, providing said substrate with a tapered aperture, said aperture being greater in cross section at one end and less in cross section at the other end than the maximum cross section of said enlarged portion, placing said wire through said aperture with said enlarged portion located in said aperture and said wire extending from the substrate surface most proximate to the other end of said aperture, and heating said substrate and said enlarged portion to melt the enlarged portion and fuse it to the substrate.

2. The method of claim 1 wherein said enlarged portion is of spherical shape.

3. The method of claim 1 wherein said substrate consists essentially of silica glass and said wire consists essentially of platinum.

4. A method for bonding electrical leads to a glassy substrate comprising the steps of providing a wire with an enlarged portion at one end, providing said substrate with a plurality of tapered apertures, each of said apertures being located at a connection point for one of said leads, said apertures being greater in cross section at one end and less in cross section at the other end than the maximum cross section of said enlarged portion, placing said wires through said apertures with said enlarged portions located in said apertures and said wires extending from the substrate surface most proximate to the other end of said apertures, uniformly pre-heating the other substrate surface, heating the other substrate surface proximate the aperture to a glowing temperature, and directly heating the enlarged lead portion to its melting temperature, whereby the enlarged portion melts and fuses to said substrate.

5. A method for manufacturing a coated circuit board with electrical contact leads extending from the uncoated side of a thin film glassy quartz or ceramic substrate board comprising the steps of providing each lead with an enlarged portion at one end, providing said substrate with a plurality of tapered bores across its width, each of said bores being located at a connection point for one of said leads, said bores being greater in cross section at one end and less in cross section at the other end than the maximum cross section of said enlarged lead portion, placing said leads through said apertures with said enlarged lead portions located in said apertures and said leads extending from the substrate surface most proximate to the other end of said apertures, heating said substrate and said enlarged lead portion to melt the enlarged lead portion and fuse it to the substrate, applying a metal to the exposed aperture walls proximate the other side of said substrate, and applying a contact pad to each of said apertures on said fused enlarged lead portion.

6. The method of claim 5 wherein said pads are applied to said enlarged lead portions by vacuum deposition.

7. The method of claim 6 wherein thin film leads are applied to said substrate by vacuum deposition.

8. A method for securing a plurality of thin film electrical insulating substrates to each other comprising the steps of providing tapered apertures across the width of said substrates, each of said apertures being substantially of hour glass shape, each half of the hour glass being a frustum conical bore, positioning said substrates in parallel planes so an aperture of one substrate is aligned with an aperture of each of the other substrates to form a column of aligned apertures, inserting a weldable, electrically conducting, sphere in each frustum conical bore of said aligned apertures, said spheres and apertures being of such relative dimensions as to effect contact of adjacent spheres through the neck of said hour glass, and welding all of said spheres located in said column of aligned apertures, together, said welding step being performed while compressing each of said spheres together and compressing the spheres inserted in the apertures to the aperture side walls.

9. The method of claim 8 wherein certain of said apertures are provided with walls of electrically conducting material and said spheres are fused to said material to effect electrical interconnections between certain of said substrates.

10. A stacked circuit module comprising a plurality of parallel electrically insulating substrates having electrically conducting members deposited thereon, said substates having apertures with tapered side walls, and a continuous column of electrically conducing spheres extending between said substrates and through said apertures in said substrates for physically and electrically connecting said substrates together, said spheres being forced against the side walls of said apertures and adjacent ones of said spheres being bonded together, and means for electrically connecting said members to said column of spheres.

11. A method for fabricating a stacked circuit module comprising the steps of providing a plurality of parallel electrically insulating substrates having apertures therein, stacking a continuous column of electrically conducting spheres between said substrates, said column extending through said apertures, said spheres contacting the side walls of said apertures, and bonding said spheres to each other while forcing the spheres against the side walls of said apertures wherein said substrates consist essentially of a glass substance and said spheres consist essentially of platinum, said bonding and forcing steps being accomplished by applying a welding tip to the sphere at each end of said column said tips being applied to the spheres with sufficient force to urge each of the spheres in the column against the adjacent side walls of its respective aperture.

12. A method for bonding an electrical lead to a thin film electrically insulating substrate comprising the steps of providing an electrical wire with an enlarged end portion, providing said substrate with an aperture having tapered side walls extending through the narrowest dimension of said substrate, placing said wire in said aperture so the enlarged end portion engages the side walls of the aperture and the other end of the lead extends through the aperture, and fusing said enlarged end portion to said side walls.

13. A method for securing an electrical lead to an electrical insulating board comprising the steps of providing an electrical lead with a substantially spherical end portion, providing said board with an aperture having a substantially frustum conical side wall extending across the narrowest dimension of said board, placing said lead in said aperture so said spherical end portion engages said side wall and the remainder of said lead extends through said aperture, and fusing said spherical end portion to said side wall.

14. A stacked circuit module comprising a plurality of parallel electrical insulating circuit boards having apertures with tapered side walls extending across the narrowest dimension of said boards, the apertures in one of said boards being partially filled with electrically conducting frusto-conical members, said members bonded and conforming to the side walls of said apertures, a separate electrical lead fused to each of said members, each of said leads extending through said apertures to one side of said board, a plurality of continuous columns of electrically conducting spheres extending between said other substrates and through said apertures in said other substrates, adjacent ones of said spheres being bonded together and certain of said spheres being forced against the side walls of said apertures, the spheres forming the bases of said columns being bonded to said electrically conducting members.

15. In combination, a plate having a substantially hour glass shape aperture through its narrowest dimension, and a pair of spherical members bonded to each other through the hour glass neck, said members frictionally engaging the side walls of said aperture.

16. A circuit module electrically connecting components contained on an electrical, insulating substrate to other elements remote from the substrate, comprising an insulating substrate having a substantially hour glass shape aperture through its narrowest dimension, a pair of electrically conducting spherical members bonded to each other through the hour glass neck, said members frictionally engaging the side walls of said aperture, and means for electrically connecting one of said spheres to a component on the substrate.

17. The module of claim 16 wherein said connecting means comprises an electrically conducting coating on the aperture side wall.

18. The module of claim 16 wherein said connecting means comprises an electrically conducting coating on said spheres.

19. A circuit module for stacking a plurality of plates comprising a plurality of parallel plates having aligned apertures, each of said apertures being of substantially hour glass shape through the narrowest dimension of said plates, and a continuous column of spheres interconnecting said plates, a pair of said spheres bonded to each other through the hour glass neck, said members frictionally engaging the side walls of each aperture.

20. The module of claim 10 wherein said means for electrically connecting includes a layer of electrically conducting material on the walls of certain of said apertures.

21. A stacked circuit module comprising a plurality of parallel electrically insulating substrates, a column of electrically conducting spheres extending between said substrates for electrically and physically connecting said substrates together, each of said spheres being secured to an adjacent sphere, said spheres being forced against walls of apertures formed across the width of said substrates, said apertures being of substantially hour glass configuration, whereby adjacent spheres are bonded together across the neck of said hour glass configurations wherein a layer of electrically conducting material subsists on the side walls of certain of said apertures.

No references cited.